(12) United States Patent
Brederlow

(10) Patent No.: US 7,598,764 B2
(45) Date of Patent: Oct. 6, 2009

(54) TRANSISTOR ARRANGEMENT

(75) Inventor: Ralf Brederlow, Poing (DE)

(73) Assignee: Infineon Technologies AG (DE)

( * ) Notice: Subject to any disclaimer, the term of this patent is extended or adjusted under 35 U.S.C. 154(b) by 156 days.

(21) Appl. No.: 11/155,322

(22) Filed: Jun. 16, 2005

(65) Prior Publication Data

US 2006/0033170 A1   Feb. 16, 2006

(30) Foreign Application Priority Data

Jun. 18, 2004   (DE) .................. 10 2004 029 520

(51) Int. Cl.
*G01R 31/26* (2006.01)
(52) U.S. Cl. .................... 324/769; 324/613; 365/185.24
(58) Field of Classification Search ................. 324/769, 324/763, 613, 614; 327/118, 307, 81; 438/14–18; 257/48; 116/345.4; 702/194
See application file for complete search history.

(56) References Cited

U.S. PATENT DOCUMENTS

| | | | | |
|---|---|---|---|---|
| 4,908,570 A | * | 3/1990 | Gupta et al. ................. | 324/765 |
| 5,612,643 A | * | 3/1997 | Hirayama ................... | 327/534 |
| 5,805,641 A | * | 9/1998 | Patel .......................... | 375/317 |
| 5,929,695 A | * | 7/1999 | Chan et al. .................. | 327/537 |
| 5,936,460 A | * | 8/1999 | Iravani ....................... | 327/543 |
| 5,970,429 A | * | 10/1999 | Martin ......................... | 702/65 |
| 6,191,647 B1 | * | 2/2001 | Tanaka et al. ................ | 327/551 |
| 6,236,224 B1 | * | 5/2001 | Schneider ................... | 324/765 |
| 6,249,556 B1 | * | 6/2001 | Rees et al. .................. | 375/354 |
| 6,297,682 B1 | * | 10/2001 | Morishima .................. | 327/327 |
| 6,417,737 B1 | | 7/2002 | Moloudi et al. | |
| 6,693,439 B1 | * | 2/2004 | Liu et al. .................... | 324/613 |
| 6,850,441 B2 | * | 2/2005 | Mokhlesi et al. ....... | 365/185.19 |
| 7,012,468 B2 | * | 3/2006 | Brederlow et al. .......... | 330/277 |
| 2002/0105308 A1 | * | 8/2002 | Tsukagoshi et al. ......... | 323/282 |

FOREIGN PATENT DOCUMENTS

| | | |
|---|---|---|
| DE | 101 17 362 A1 | 10/2002 |
| DE | 101 17 362 A1 | 10/2002 |
| WO | WO-02/082256 A2 | 10/2002 |

OTHER PUBLICATIONS

Ralf Brederlow et al.; "Influence of Fluorinated Gate Oxides on the Low Frequency Noise of MOS Transistors under Analog Operation"; In: Proceedings of the 28th European Solid-State Device Research Conference, (1998), pp. 472-475.
Ralf Brederlow et al.; "Fluctuations of the Low Frequency Noise of MOS Transistors and their Modeling in Analog and RF-Circuits"; IEDM 1999 Tech. Dig., pp. 159-162.
S. Christensen et al.; "Low Frequency Noise in MOS Transistors - I Theory"; Solid-State Electronics, 1968, vol. 11, pp. 797-812.

* cited by examiner

*Primary Examiner*—Ha Tran T Nguyen
*Assistant Examiner*—Arleen M Vazquez
(74) *Attorney, Agent, or Firm*—Dickstein, Shapiro, LLP.

(57) ABSTRACT

A transistor arrangement having a multiplicity of transistors interconnected with one another, having a noise detection device, which is set up for detecting the 1/f noise of at least one portion of the transistors, having a selection device, which is set up for selecting at least one of the transistors, on the basis of the ascertained 1/f noise characteristic of the transistors, in the case of which the 1/f noise is sufficiently low.

30 Claims, 4 Drawing Sheets

TRANSISTOR ARRANGEMENT

CROSS-REFERENCE TO RELATED APPLICATION

This application claims priority to German Patent Application Serial No. 10 2004 029 520.4-33, which was filed on Jun. 18, 2004.

FIELD OF THE INVENTION

The invention relates to a transistor arrangement.

BACKGROUND OF THE INVENTION

Transistors, in particular field-effect transistors such as MOS transistors, are employed in many integrated circuits. The noise of a MOS transistor limits the resolution of such a circuit. Noise is a limiting factor for the performance of a circuit particularly when said circuit has to process a signal having a very small amplitude or when a plurality of signals having a different bandwidth are to be processed simultaneously. Consequently, the performance particularly of analogue circuits is limited by the phenomenon of noise. In the course of scaling of CMOS technology in the range below 100 nanometers, noise influences increase continuously with each new technology generation.

A particular problem is posed by low-frequency noise (LF noise) which can be observed in MOS transistors. Low-frequency noise is caused by the random charging and discharging of defects to the interface between the transistor channel and the gate dielectric. At low frequencies, this mechanism supplies the dominant noise contribution. The corresponding defects are also called interface states on account of their spatial position.

It is known from Brederlow, R et al. (1998) "Influence of fluorinated gate oxides on low-frequency noise of MOS transistors under analog operation", In: Proceedings of the 28th European Solid State Device Research Conference, pp. 472-475, that the noise contributions of individual defects can be detected metrologically particularly in the case of very small transistors.

Since low-frequency noise is grounded in the physics of the components used or is linked to the quality of the interface between the channel region and the gate insulating layer by way of the so-called interface state density, it is attempted in accordance with the prior art to improve low-frequency noise properties essentially by means of optimizing the fabrication process. However, narrow limits are imposed on such technological optimization possibilities. Examples of improving the fabrication process in order to suppress low-frequency noise are disclosed in Brederlow, R et al. (1999) "Fluctuations in the Low Frequency Noise of MOS transistors and their Modeling in analog and RF-Circuits", IEDM 1999 Tech. Dig., pp. 159-162.

Another approach known from the prior art for suppressing low-frequency noise consists in positioning or choosing the operating point of the transistors such that the noise is reduced or even minimized. It is known, for example, that the choice of the operating point in the context of analogue circuitry (suitable operating points therein are typically $V_g - V_t = 100$ mV to 500 mV, where $V_d > V_g - V_t$, where $V_g$ is the gate voltage, $V_t$ is the threshold voltage and $V_d$ is the drain voltage of the transistor) permits a noise minimum to be achieved, see e.g. Christensen, S et al. (1968) "Low frequency noise in MOS transistors—I theory", Solid-St. El. 11, pp. 791-812. What is disadvantageous about this concept is the limitation of the degrees of freedom in the circuit designed from a different standpoint e.g. with regard to the power consumption, the driving range, the bandwidth, etc. Furthermore, the gain in performance that can be obtained with the adjustment of the operating point of the transistor is small.

Since the low-frequency noise voltages or noise currents of a MOS transistor are inversely proportional to the root of the active area thereof (see e.g. Christensen, S et al.), there is the possibility of reducing the low-frequency noise of a circuit by choosing the component areas to be large. However, one disadvantage of this method results from the increased area taken up, but it may also result from an increased power consumption. This last necessarily results if the bandwidth of the circuit cannot be reduced, since then the widths but not the lengths of the transistors can be increased. The current consumption in the circuit with regard to the paths in which the relevant transistors are operated rises approximately proportionally to the width of the relevant transistors. Furthermore, all capacitive loads brought about by a given circuit rise, such, in particular, the input capacitance of sensitive amplifier circuits. A higher AC power loss also occurs for this reason.

DE 101 17 362 A1 discloses a random number generator having a semiconductor component having at least one electrically active defect in the structure of the semiconductor component, having an occupation detection unit, which is coupled to the semiconductor component and which is set up in such a way that an occupation or a change of the occupation in the electrically active defect can be ascertained, and having a random number conversion unit, which is coupled to the occupation detection unit and which is set up in such a way that a random number is formed from the ascertained occupation or the ascertained change of the occupation in the electrically active defect.

SUMMARY OF THE INVENTION

The invention is based on the problem, in particular, of effectively reducing the low-frequency noise in a transistor circuit.

The transistor arrangement according to the invention contains a multiplicity of transistors interconnected with one another, a noise detection device, which is set up for detecting the noise characteristic of at least one portion of the transistors, and a selection device, which is set up for selecting at least one of the transistors on the basis of the ascertained noise characteristic of the transistors.

BRIEF DESCRIPTION OF THE DRAWINGS

Exemplary embodiments of the invention are illustrated in the figures and are explained in more detail below.

Identical or similar components in different figures are provided with identical reference numerals.

The illustrations in the figures are schematic and not to scale.

DETAILED DESCRIPTION OF PREFERRED EMBODIMENTS OF THE INVENTION

Figure 1:
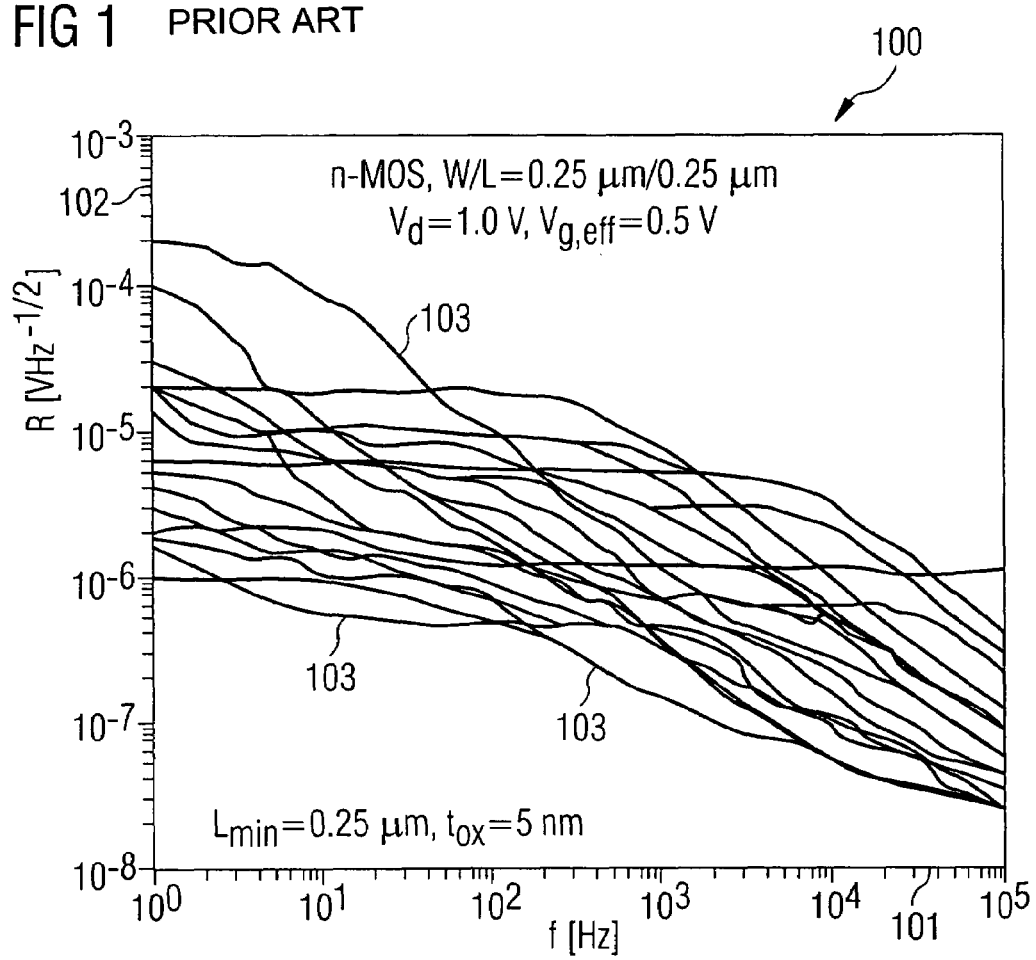
FIG. 1 shows a diagram in accordance with the prior art in which the gate voltage noise of different transistors is plotted for different frequencies.

One basic idea of the invention is to be seen in interconnecting a plurality of transistors (typically of the order of magnitude of a few tens to a few hundreds) with one another, in ascertaining the noise characteristic of said transistors and in selecting those transistors in the case of which the noise, in particular the low-frequency noise, is sufficiently low. The transistors having a sufficiently low noise characteristic can then be interconnected with one another in order to realize a circuitry application which is sought. In particular, these transistors may jointly replace the functionality of another transistor or jointly form the functionality of a high-performance transistor, the effective low-frequency noise thereby being suppressed and the signal processing performance consequently being improved.

The transistor arrangement according to the invention affords a circuitry solution to the problem of noise in circuits in the case of which the discrete physical properties of the interface states are used in order to significantly reduce, with the aid of a suitable circuit architecture and a noise detection or calibration routine, the noise of the arrangement made up of the selected transistors or the contributions of the individual transistors contained therein.

Since the low-frequency noise can fluctuate by several orders of magnitude between different transistors, the selection of low-noise transistors is a particularly effective procedure for suppressing the noise of a transistor arrangement. Consequently, the noise suppression with the transistor arrangement according to the invention has a considerably greater improvement potential than the possibilities known from the prior art. However, it is possible and advantageous to synergistically combine the concept of the invention with the solution approaches known from the prior art (optimization of the fabrication process—suitable choice of the transistor operating point—increasing the active area of transistors) in order to achieve a noise characteristic reduced even further. The low-frequency noise (1/f noise, where f is the frequency) can thereby be prevented particularly effectively.

Clearly, the transistor arrangement according to the invention makes use of the fact that, particularly in the case of small-area transistors, large fluctuations in the 1/f noise power of the individual transistors occur on account of statistical effects. This effect is utilized with the aid of suitable circuitry for reducing the 1/f noise of a circuit.

For this purpose, the transistors in a circuit which determine the 1/f noise of the circuit are preferably divided into individual transistors. These individual transistors are interconnected with one another according to the invention, so that a larger transistor having a larger width can be formed from small transistors having a small width. It is advantageous to embody the individual transistors, with regard to the transistor width, to be minimal or at least very small (transistors having a width of at least double the minimum width often have better analogue properties, in particular gm/gds), the total width of an original circuit transistor to be replaced being divided into a plurality of individual width of the smaller transistors. The individual transistors are preferably present in a substantially larger number than results from the condition that the sum of the widths of the individual transistors is equal to the width of the circuit transistor. A redundancy is thereby obtained which makes it possible with the aid of a calibration routine and a calibration circuit (e.g. an assessment unit and a memory) to find suitable individual transistors which have a lowest possible 1/f noise. If, with the aid of a selection device, for example with the aid of a decoder, the low-noise transistors are selected for which a corresponding identification is stored in the memory in order to connect them together to form circuit transistors, then the result is significantly less noise of the circuit transistors and, consequently, also an overall circuit having lower noise. Even existing circuits can easily be modified to apply the principal of the invention thereto.

The latency resulting from the calibration or noise detection and selection prior to operation of the circuit in many cases has no effect or only a very small effect on the time resolution of the circuit since such a latency is present anyway in may cases, e.g. in order to load an operating system. Even if the realization of the transistor arrangement according to the invention necessitated additional switches, the associated circuitry would be of little importance for increasing the capacitances and resistances since this plays a secondary part in circuits in which an effective suppression of the 1/f noise has a particularly pronounced effect (namely in particular circuits which operate sufficiently far removed from the technological limits of a process used) and in which the implementation of the principle according to the invention thus avoids particularly major advantages.

The invention's suppression of the low-frequency noise with the transistor arrangement of the invention has the advantage that, given suitably large redundancy of the transistors, a reduction of the noise by one to two orders of magnitude or more is possible since the noise powers of the individual transistors may typically fluctuate by two to three orders of magnitude (see Brederlow, R et al.). Such a great reduction of the 1/f noise cannot be achieved with any of the solution approaches known from the prior art without an appreciably greater outlay with regard to circuit architecture, chip area or required technology. Moreover, the transistor arrangement according to the invention can be combined synergistically with all methods known from the prior art, whereby a maximum reduction of the noise can be achieved.

It should be noted that, as an alternative to the equivalent selection of the transistor widths, the transistor arrangement of the invention can be configured such that the same current flows at the same operating point, that is to say that the transistors in the transistor arrangement preferably have the same or at least similar properties. The mismatch of electronic parameters of different transistors shall also be mentioned in this connection.

Clearly, the invention provides an arrangement of small-dimensioned transistors, preferably field-effect transistors, the noise voltage of which is detected. A predetermineable number of these small-dimensioned transistors (e.g. those with the lowest noise) are then connected together in order to replace a larger transistor, thereby achieving a low-noise realization of the larger transistor. This involves recognizing and making use in particular of the effect that the fluctuation range of the intensity of the 1/f noise is particularly large in the case of small-dimensioned transistors, so that a sufficiently large transistor bank of small-area transistors, for statistical reasons, will always contain transistors which have a very low noise.

The transistors may have a width which is less than the width of transistors of the technology standard (i.e. in particular than the width of transistors in the context of the process technology chosen) in which the transistor arrangement is produced. In other words, the width of the transistors in a transistor arrangement may be less than the width of a conventional noisy transistor which is precisely intended to be replaced by the transistor arrangement. Consequently, the individual small transistors, i.e. the transistors of the transistor arrangement of the invention, may be dimensioned to be substantially smaller than the transistor to be replaced. For process-technological reasons, however, they ought not to be smaller than the minimum permissible width within the process technology chosen (usually given by the lithographic resolution).

The sum of the widths of the transistors may be greater (preferably substantially greater) than the width of the transistor of the technology standard in which the transistor arrangement is produced. By virtue of the fact that the sum of the transistor widths of the transistors that replace the transistors to be replaced is chosen to be greater than the transistor width of the original transistor, a sufficient redundancy is obtained which makes it possible for the selection device, in many cases and in any event on average statistically, to find particularly low-noise transistors which it can interconnect with one another for the purpose of realizing a circuitry application.

The noise detection device may be set up for detecting the intensity of the 1/f noise of each of the transistors. The 1/f noise in particular has greatly different values for different transistors, so that the selection of particularly low-noise transistors has a particularly great effect for the suppression of the 1/f noise.

The selection device may be set up for selecting a predetermineable number of the transistors in the case of which the intensity of the noise is the lowest.

Furthermore, an interconnection device may be provided, which is set up for interconnecting the transistors selected by means of the selection device for the purpose of realizing a predetermined circuitry application. The interconnection device interconnects the transistors selected by means of the selection device with one another in such a way that the transistors interconnected in this way fulfill a specific circuitry functionality (e.g. differential input stage, current mirror, AND gate, inverter, etc.) which is sought for a specific application. If the selected transistors are intended for example to replace the functionality of another individual transistor, then the individual transistors are to be interconnected such that they effectively fulfill the functionality of an individual transistor. For this purpose, the transistors may, in particular, be connected in parallel with one another. However, it is also possible as an alternative for the individual transistors to be interconnected in such a way that more complex tasks are realized by this interconnection, such as, for example, the functionality of a differential stage, of a current mirror, of an operational amplifier, of a multiplexer, of an inverter, of a comparator of a logic gate, etc.

The transistors may thus be connected in parallel with one another.

The transistors may be field-effect transistors, in particular MOS-FETs. The invention is not restricted to conventional planar MOS-FETs, but rather may also be applied to vertical transistors, double gate transistors, fin field-effect transistors, etc. The use of field-effect transistors is particularly advantageous since, in the case of these transistors, the fluctuation of the intensity of the 1/f noise is particularly large and, consequently, the potential that can be exhausted for reducing the noise is likewise particularly large. Nevertheless, the invention may also be realized with other types of transistors, e.g. with bipolar transistors.

The noise detection device may be set up for detecting a noisy electrical signal from each of the transistors. Said electrical signal is for example a voltage signal or a current signal.

Furthermore, the noise detection device may have a bandpass filter or a low-pass filter or a high-pass filter, by means of which the noisy electrical signal can be filtered prior to an evaluation of the signal, in order to eliminate electronic parameter fluctuations caused by DC offsets or by thermal noise, by way of example. It is an aim of the invention, in particular, to suppress the low-frequency 1/f noise. In order to effectively suppress other interference components (e.g. parameter mismatch, noise components) during the detection of the noise, these can be filtered out from the noisy electrical signal. In particular, a bandpass filter or a low-pass filter may be used for this purpose since these filters eliminate high-frequency noise that is not attributable to i/f noise from the electrical signal. The use of a high-pass filter for eliminating a DC offset is also advantageous.

The noise detection device may be set up for detecting a noisy electrical signal from each of the transistors at a plurality of electrical voltages. In other words the noise detection device can measure, for different electrical voltages, the intensity of the noise, in particular of the low-frequency noise of the individual transistors. The redundant measurement of the noise characteristic at different voltages enables a reliable decision basis as to which of the transistors are classified as low-noise and which are not, and is important for assessing the noise amplitude (successive approximation).

In the case of the transistor arrangement, the noise detection device may furthermore be set up for detecting a noisy electrical signal from each of the transistors at a plurality of frequencies. Consequently, it is possible to ascertain, specifically for a frequency sought or a frequency band sought, which transistors have a particularly low noise and are thus particularly well suited to forming a low-noise circuit.

The transistor arrangement may furthermore have a threshold voltage detection device, which is set up for detecting the value of the threshold voltage of at least one portion of the transistors, the selection device being set up for selecting at least one of the transistors on the basis of the ascertained noise characteristic and on the basis of the ascertained threshold voltage or an offset of the transistors.

In accordance with this refinement, a large transistor is replaced by a plurality of small transistors on the basis of two criteria. Firstly, the noise is to be as low as possible; secondly, the threshold voltage of the small transistors is to deviate from one another, so that they can fulfill a defined functionality in a common interconnection. Excessively greatly different threshold voltages of the transistors that are interconnected later, called individual transistors hereinafter, may be disturbing for some applications, particularly if the individual transistors are interconnected to form a pair of functional transistors. Therefore, a combination of the noise characteristic and the threshold voltage characteristic may be used as a decision criteria for the selection of transistors.

As an exemplary application example, a differential pair of two large field-effect transistors which are intended to be replaced in each case by a plurality of small field-effect transistors may be considered. For a good performance of such a differential pair, it is desirable, on the one hand, that the noise of the large field-effect transistors and therefore the noise of the selected smaller field-effect transistors is to be low; on the other hand, the two large field-effect transistors must match one another with regard to their threshold voltages, so that the threshold voltages of the smaller field-effect transistors should also match one another. The selection of small transistors for replacing the larger field-effect transistors is effected such that both requirements are satisfied.

The transistor arrangement may be integrated, preferably monolithically integrated, on and/or in an electronic chip. A semiconductor chip, in particular a silicon chip, may be used as the chip.

The transistor arrangement may also be integrated in a first partial region on and/or in an electronic chip of a wafer, and may be integrated in a second partial region on and/or in a scribing frame of the wafer (also referred to as sawing frame). A wafer is often divided into a multiplicity of chips, unused regions, the so-called scribing frame being formed between adjacent chips. This may expediently be used by forming a portion of the components of the transistor arrangement in said scribing frame, whereby the useful area of the wafer required for forming the transistor arrangement is reduced. In particular at least one portion of the noise detection device and/or at least one portion of the selection device and/or at least one portion of the threshold voltage detection device may advantageously be formed in such a scribing frame region.

A description is given below, referring to FIG. 1, of a diagram 100 in which the noise of transistors is plotted as a function of the frequency.

The diagram 100 from FIG. 1 contains an abscissa 101, along which the frequency f in Hz is plotted in a logarithmic mode of representation. The gate voltage noise R in $VHz^{-1/2}$ is plotted in a logarithmic mode of representation along an ordinate 102 of the diagram 100.

The diagram 100 shows the variation of the low-frequency noise of various small-area transistors (represented by various curve profiles 103) in a 0.25 μm process. According to the invention, from the many noise characteristic curves, only those which have the lowest noise are picked out. The average noise of a larger transistor, comprising a parallel circuit of many such low-noise small transistors can thus be significantly reduced. In order to make this principle available for the integrated circuit, namely the transistor arrangement according to the invention, the noise of each individual small transistor is detected. Afterward, only the low-noise transistors are interconnected to form a larger transistor that is used in the circuit. It can be seen from the noise spectra of minimal transistors of a 0.25 μm technology generation from FIG. 1 that the noise of different transistors at a fixed frequency may vary by several orders of magnitude (typically two to three orders of magnitude), so that a particularly effective suppression of the 1/f noise is made possible according to the invention.

A description is given below, referring to FIG. 2, of a transistor arrangement 200 in accordance with a first exemplary embodiment of the invention.

In the case of the transistor arrangement 200, a plurality of transistors 201 are connected in parallel with one another. That is to say that the source terminals of the transistors 201 are coupled to one another and that the drain terminals of the transistors 201 are coupled to one another. The source terminals of the transistors 201 can be coupled to a common source terminal 202. A sixth switch element 213 is connected between the source terminals of the transistors 201 and the common source terminal 202. The drain terminals of the transistors 201 can be coupled to a common drain terminal 203 if fifth 212 and second 209 switch elements arranged between the drain terminals of the transistors 201 and the common drain terminal 203 are closed. The gate terminals of the transistors 201 are coupled to a selection device 205. The selection device 205 can be coupled to a common gate terminal 204 if a first switch element 208 is closed. Furthermore, the switching unit 205 can be coupled to a first voltage source 206 $V_{Gate}$ if a third switch element 210 is closed. If a fourth switch element 211 is closed, the first voltage source 206 $V_{Gate}$ is coupled to the source terminals of the transistors 201. If a seventh switch element 214 is closed, the drain terminals of the transistors 201 are coupled to a current source 207 $I_{Drain}$. If an eighth switch element 215 is closed, the source terminals of the transistors 201 are coupled to the current source 207 $I_{Drain}$. The arrangement described can be operated in a calibration mode and in an operating mode. In the calibration mode, the switches 210, 211, 212, 214, 215 are in the switch position "K", as shown in FIG. 2. In the calibration mode, noise voltages of the transistors 201 are measured and those transistors which are to be used for a subsequent circuitry application on account of their low noise are selected. In an operating mode, the switches 208, 209, 213 are in the position "B" shown in FIG. 2, so that corresponding transistors 201 are then interconnected with one another in such a way that they realize a desired circuitry application.

That terminal of the current source 207 which can be coupled to the drain terminal of the transistors 201 is coupled to one input of a bandpass filter 216. That terminal of the current source 207 which can be coupled to the source terminals of the transistors 201 is coupled to another terminal of the bandpass filter 216, so that signals at source and drain terminals of the transistors 201 can be filtered by means of the bandpass filter 216. The signals of the source and drain terminals of the transistors 201 filtered in this way, which are present at outputs of the bandpass filter 216, can be provided at the amplifier 217, at the inputs thereof, an output of the amplifier 217 being coupled to the inverting input of a comparator 218. The non-inverting input of the comparator 218 is coupled to a second voltage source 219 $V_{ref1}$, which can furthermore be coupled to the source terminals of the transistors 201. On account of the differential functionality of the comparator 218 the inputs of the comparator 218 can be connected up oppositely to the manner described. The comparator 218 is controlled by means of a clock generator 220 via a control input. An output of the comparator 218 is coupled to a first counter 221 and to a second counter 222. The outputs of the first and second counters 221, 222 are coupled to inputs of a comparison unit 223, the output of which is coupled to an input of a third counter 225. An output of the third counter 225 is coupled to an input of an evaluation unit 226, the output of which is coupled to a memory device 227. The memory device 227 can transmit a control signal to the selection device 205.

Figure 2:
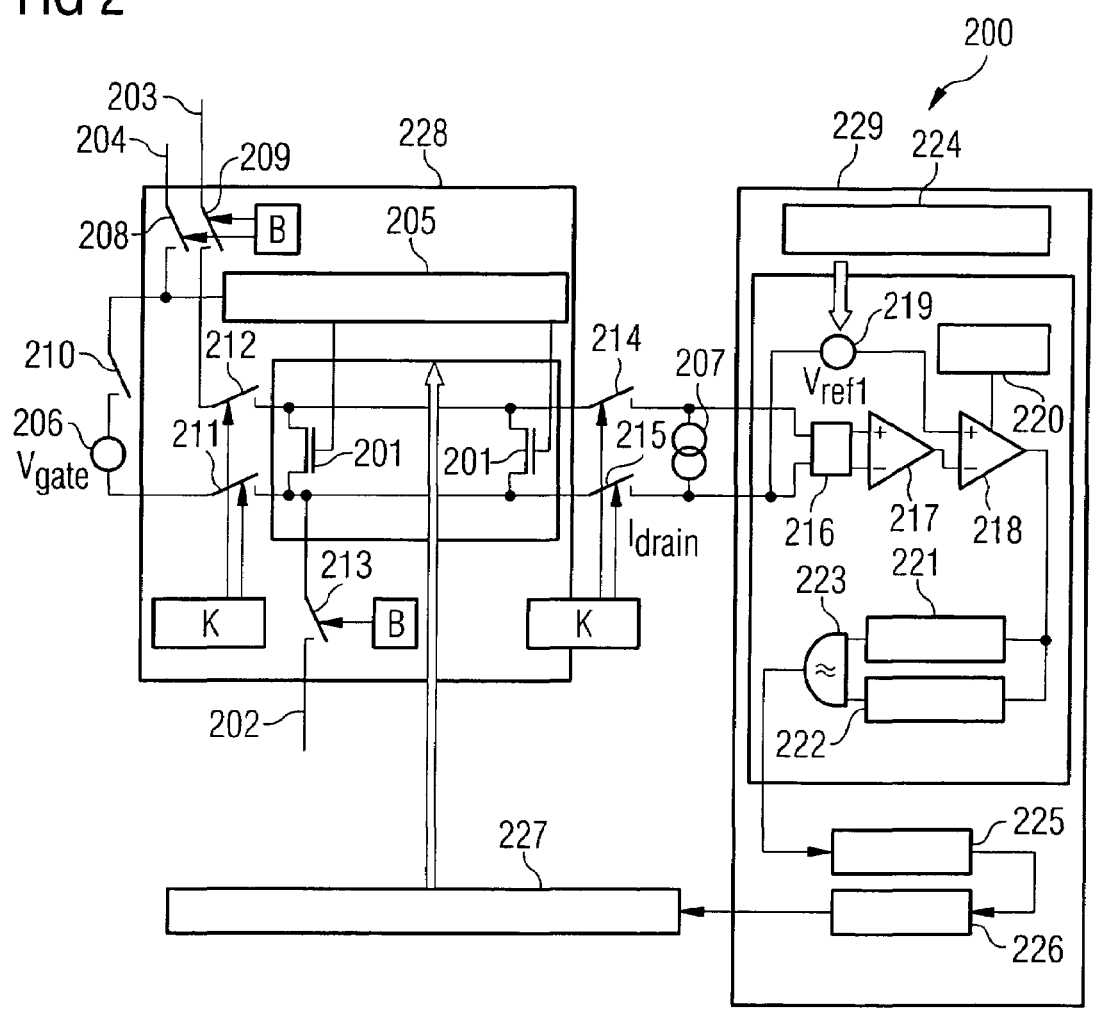
FIG. 2 shows a transistor arrangement in accordance with a first exemplary embodiment of the invention.

The frame provided with reference symbol 228 in FIG. 2 represents the effective transistor formed by selected, low-noise transistors of the transistors 201. The frame provided with reference symbol 229 in FIG. 2 represents the noise detection device of the transistor arrangement 200.

The functionality of the transistor arrangement 200 is described below.

In order to obtain information about the noise behavior of the individual small transistors 201 in the transistor arrangement 200, the switches 208 to 215 are brought to the position "calibration" (K). with the aide of the decoder 205, only in each case one of the transistors 201 of the transistor arrangement 200 is successively supplied with a suitable gate voltage and a drain current. These values are preferably the same values as in the circuit operation of the transistor arrangement 200. The noise of the respective transistor 201 is then assessed. For this purpose, a noisy signal of a transistor 201 is firstly bandpass-filtered using the bandpass filter 216 in order to remove high-frequency white noise and offset components. Afterward, this filtered signal is amplified by means of the amplifier 217. The amplified noise signal is then compared with a reference voltage $V_{ref1}$ by means of the comparator 218. In accordance with FIG. 2, this is effected at time intervals which are determined by the clock signal of the clock generator 220, and which preferably correspond to the inverse of the maximum frequency that is important in the circuit used later, in order thus to obtain noise information about the entire important frequency range. The bits output by the comparator 218 are sorted according to zeros and ones, counted and compared. The first counter 221 counts the values having the logic value "0", and the second counter 222 counts the values having the logic value "1". A comparison unit 223 compares the outputs of the counters 221, 222. If the number of zeros is approximately equal to the number of ones, the comparison unit 223 outputs an output signal having a logic value "1". Afterward, the reference voltage is altered repeatedly (preferably enough times that the range of minimum to maximum peak noise voltages to be expected is covered by the range of reference voltages) by a small magnitude (large enough that not too many measurements have to be made, but also small enough to be able to separate the noise properties of the individual array transistors) and the procedure is carried out anew. The number of ones output by the comparison unit 223 in this case is counted. It represents large noise activity in a specific voltage range. The third counter 225 connected downstream counts the number of ones output for a specific array transistor 201. If this number falls below a specific threshold value of ones, the transistor examined is regarded as a low-noise transistor. Its position is then stored in the memory device 227 (memory for the position of suitable transistors) and enabled for operation in the context of the circuitry application in the decoder 205. The procedure is then repeated progressively for all array transistors 201. For applications for which an even higher accuracy is desired, the characterization can also be carried out for different frequency ranges: firstly by means of a configurable bandpass filter 216, secondly also by means of variable clock-frequencies of the clock generator 220. With such a procedure and circuit, the noise of all array transistors 201 can be characterized with regard to its magnitude in different frequency ranges.

The selection of transistors may also be effected in accordance with the criterion that a predetermineable number N of transistors having the lowest possible noise is to be selected.

A description is given below, referring to FIG. 3, of a transistor arrangement 300 in accordance with a second exemplary embodiment of the invention.

In addition to the transistor arrangement 200, the transistor arrangement 300 contains a threshold voltage detection device 301, which is set up for detecting the value of the threshold voltage of the MOS transistors 201, the selection device 205 being set up for selecting MOS transistors 201 on the basis of the noise characteristic ascertained by the noise detection device 229 and on the basis of the threshold voltage of the MOS transistors 201 ascertained by the threshold voltage detection device 301.

The threshold voltage detection device 301 contains an additional amplifier 302 (as an alternative, the amplifier 217 can also be used for this function, but it would then have to be provided such that it could be changed over), the inputs of which are coupled to the outputs of a low-pass filter 307. The inputs of the low-pass filter 307 are coupled to the two terminals of the current source 207. The signal of an examined MOS transistor 201 that is amplified by the additional amplifier 302 is fed to an additional comparator 303, which compares the signal with a reference value of a third voltage source 306 $V_{ref2}$, the additional comparator 303 being controlled by an evaluate unit 304. The voltage of the third voltage source 306 is controlled by means of an additional voltage control unit 305. At the output of the comparator 303, a thermometer code in which the threshold voltage of an examined MOS transistor 201 is coded is provided by the comparison voltages set one after the other (with each new value of voltage source 306). This information is stored in the memory device 227 and is used together with the ascertained noise voltage characteristic of the examined MOS transistor 201 as a criterion for interconnecting suitable MOS transistors 201 with one another in order to form or replace a larger transistor.

Figure 3:
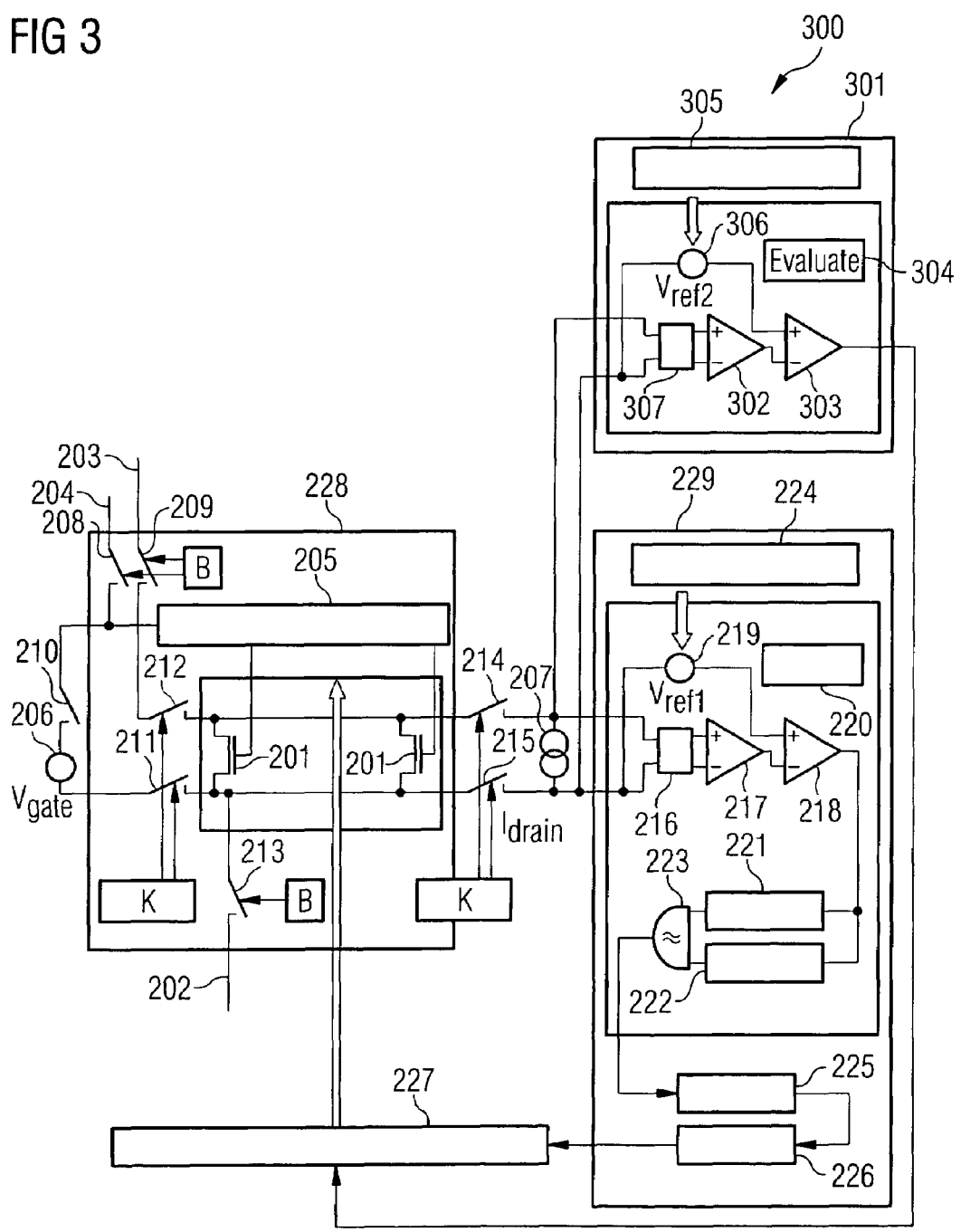
FIG. 3 shows a transistor arrangement in accordance with a second exemplary embodiment of the invention.

The switches in FIGS. 2 and 3 may be provided in a controllable fashion, so that data stored in an EEPROM ("electrically erasable programmable read-only memory") for example may be used as control signals for the switches. As an alternative, data stored in invariable fashion in an OTPROM ("one-time programmable read-only memory") may be used as fixed control signals for the switches. The setting of the switches may also be effected using a via-programming.

Figure 4:
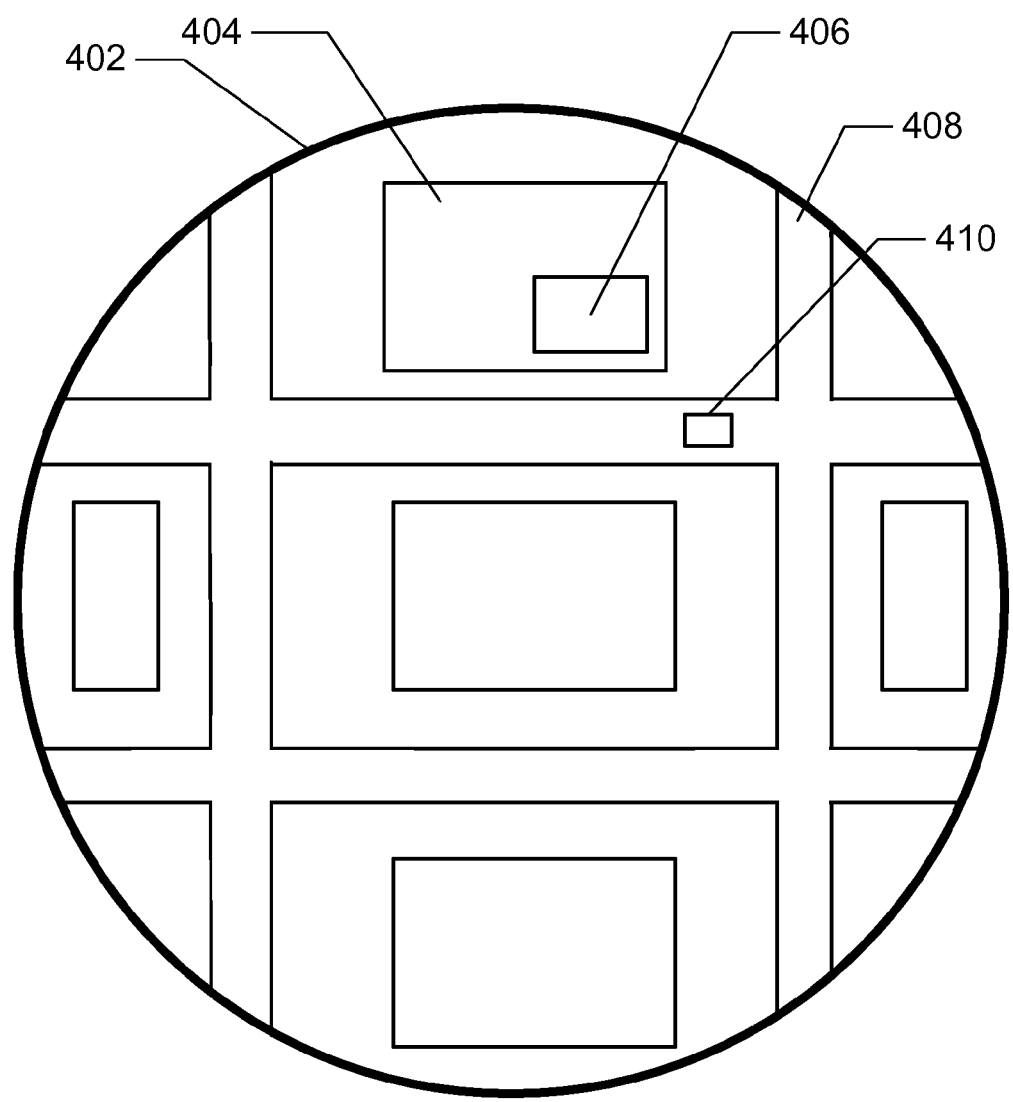
FIG. 4 depicts a wafer in accordance with an embodiment of the invention.

FIG. 4 depicts a wafer 402. Wafer 402 includes a plurality of electronic chips 404. Scribing frame 408 separates the chips 404. As shown, a first part or first partial region 406 is integrated on or in the electronic chip 404. A second part 410 is shown integrated on or in the scribing frame.

The invention claimed is:

1. A transistor arrangement comprising:
a plurality of transistors interconnected with one another;
a noise detection device that detects the intensity of the 1/f noise of the noise characteristic of the plurality of transistors; and
a selection device that selects at least one of the plurality of transistors based on the detected 1/f noise of the transistors, when the 1/f noise is detected to be below a specific threshold value.

2. The transistor arrangement as claimed in claim 1, wherein the transistors have a width which is less than the width of transistors of a technology standard in which the transistor arrangement is produced.

3. A transistor arrangement as claimed in claim 2, wherein a sum of the widths of the transistors is greater than the width of a transistor of the technology standard in which the transistor arrangement is produced.

4. The transistor arrangement as claimed in claim 1, wherein at a predetermined operating point, electric current flowing through the transistors is essentially the same.

5. The transistor arrangement as claimed in claim 1, wherein the selection device selects a predetermined number of the transistors when the intensity of the noise is lowest.

6. The transistor arrangement as claimed in claim 1, further comprising an interconnection device that interconnects the transistors selected by the selection device in order to realize a predetermined circuitry application.

7. The transistor arrangement as claimed in claim 1, wherein the transistors are connected in parallel with one another.

8. The transistor arrangement as claimed in claim 1, wherein the transistors are field-effect transistors.

9. The transistor arrangement as claimed in claim 1, wherein the noise detection device detects a noisy electrical signal from each of the transistors.

10. The transistor arrangement as claimed in claim 9, wherein the noise detection device has at least one of a band-pass filter, a low-pass filter, and a high-pass filter, for filtering the noisy electrical signal prior to the noise detection device evaluating the signal.

11. The transistor arrangement as claimed in claim 9, wherein the noise detection device detects a noisy electrical signal from each of the transistors at a plurality of electrical voltages.

12. The transistor arrangement as claimed in claim 9, wherein the noise detection device detects a noisy electrical signal from each of the transistors at a plurality of frequencies.

13. The transistor arrangement as claimed in claim 1, further comprising a threshold voltage detection device for detecting a value of a threshold voltage of at least one portion of the transistors, wherein the selection device selects at least one of the transistors based on the detected noise and the detected threshold voltage of the transistors.

14. The transistor arrangement as claimed in claim 1, which is integrated on and/or in an electronic chip.

15. The transistor arrangement as claimed in claim 1, wherein a first partial region is integrated on and/or in an electronic chip of a wafer, and in which a second partial region comprising at least one portion of the noise detection device and/or at least one portion of the selection device and/or at least one portion of the threshold voltage detection device is integrated on and/or in a scribing frame of the wafer.

16. A transistor arrangement comprising:
a plurality of transistors interconnected with one another;
a noise detection means for detecting the intensity of a 1/f noise of the noise characteristic of the plurality of transistors; and
a selection means for selecting at least one of the plurality of transistors based on the detected 1/f noise of the transistors, when the 1/f noise is detected to be below a specific threshold.

17. The transistor arrangement as claimed in claim 16, wherein the transistors have a width which is less than the width of transistors of a technology standard in which the transistor arrangement is produced.

18. A transistor arrangement as claimed in claim 17, wherein a sum of the widths of the transistors is greater than the width of a transistor of the technology standard in which the transistor arrangement is produced.

19. The transistor arrangement as claimed in claim 16, wherein at a predetermined operating point, electric current flowing through the transistors is essentially the same.

20. The transistor arrangement as claimed in claim 16, wherein the selection means selects a predetermined number of the transistors when the intensity of the noise is lowest.

21. The transistor arrangement as claimed in claim 16, further comprising an interconnection means for interconnecting the transistors selected by the selection means in order to realize a predetermined circuitry application.

22. The transistor arrangement as claimed in claim 16, wherein the transistors are connected in parallel with one another.

23. The transistor arrangement as claimed in claim 16, wherein the transistors are field-effect transistors.

24. The transistor arrangement as claimed in claim 16, wherein the noise detection means detects a noisy electrical signal from each of the transistors.

25. The transistor arrangement as claimed in claim 24, wherein the noise detection means has a filtering means for filtering the noisy electrical signal prior to the noise detection means evaluating the signal.

26. The transistor arrangement as claimed in claim 24, wherein the noise detection means detects a noisy electrical signal from each of the transistors at a plurality of electrical voltages.

27. The transistor arrangement as claimed in claim 24, wherein the noise detection means detects a noisy electrical signal from each of the transistors at a plurality of frequencies.

28. The transistor arrangement as claimed in claim 16, further comprising a threshold voltage detection means for detecting a value of a threshold voltage of at least one portion of the transistors, wherein the selection means selects at least one of the transistors based on the detected noise and the detected threshold voltage of the transistors.

29. The transistor arrangement as claimed in claim 16, which is integrated on andior in an electronic chip.

30. The transistor arrangement as claimed in claim 16, wherein a first partial region is integrated on and/or in an electronic chip of a wafer, and in which a second partial region comprising at least one portion of the noise detection device and/or at least one portion of the selection device and/or at least one portion of the threshold voltage detection device is integrated on and/or in a scribing frame of the wafer.

* * * * *